(12) United States Patent
Zeyen et al.

(10) Patent No.: US 9,330,874 B2
(45) Date of Patent: May 3, 2016

(54) SOLDER BUMP SEALING METHOD AND DEVICE

(71) Applicant: Innovative Micro Technology, Goleta, CA (US)

(72) Inventors: Benedikt Zeyen, Santa Barbara, CA (US); Vikram Patil, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 51 days.

(21) Appl. No.: 14/456,972

(22) Filed: Aug. 11, 2014

(65) Prior Publication Data

US 2016/0042902 A1  Feb. 11, 2016

(51) Int. Cl.
*H01H 59/00* (2006.01)
*H01H 49/00* (2006.01)

(52) U.S. Cl.
CPC .......... *H01H 59/0009* (2013.01); *H01H 49/00* (2013.01)

(58) Field of Classification Search
CPC ..................... H01H 59/0009; H01H 59/00
See application file for complete search history.

(56) References Cited

U.S. PATENT DOCUMENTS

| | | | |
|---|---|---|---|
| 4,739,917 A | 4/1988 | Baker | |
| 5,964,963 A | 10/1999 | Turchan et al. | |
| 6,621,135 B1 * | 9/2003 | Sridhar | H01H 9/0009 257/415 |
| 7,008,812 B1 | 3/2006 | Carley | |
| 7,528,691 B2 | 5/2009 | Wallis et al. | |
| 7,785,913 B2 | 8/2010 | Foster et al. | |
| 7,864,006 B2 | 1/2011 | Foster et al. | |
| 7,893,798 B2 | 2/2011 | Foster et al. | |
| 2002/0014673 A1 * | 2/2002 | Leedy | G03F 7/70658 257/419 |
| 2003/0042567 A1 * | 3/2003 | Tilmans | B81B 7/0006 257/508 |
| 2004/0231884 A1 | 11/2004 | Wong et al. | |
| 2005/0206483 A1 * | 9/2005 | Pashby | H01H 59/0009 333/262 |
| 2006/0017533 A1 | 1/2006 | Jahnes et al. | |
| 2006/0086376 A1 | 4/2006 | Dimeo, Jr. et al. | |
| 2007/0256917 A1 | 11/2007 | Oberhammer et al. | |
| 2011/0068654 A1 | 3/2011 | Cheng et al. | |
| 2012/0256308 A1 | 10/2012 | Helin | |

* cited by examiner

*Primary Examiner* — Mohamad Musleh
(74) *Attorney, Agent, or Firm* — Jaquelin K. Spong

(57) ABSTRACT

A method for forming a cavity in a microfabricated structure, includes the sealing of that cavity with a low temperature solder. The method may include forming a sacrificial layer over a substrate, forming a flexible membrane over the sacrificial layer, forming a release hole through a flexible membrane to the sacrificial layer, introducing an etchant through the release hole to remove the sacrificial layer, and then sealing that release hole with a low temperature solder.

18 Claims, 8 Drawing Sheets

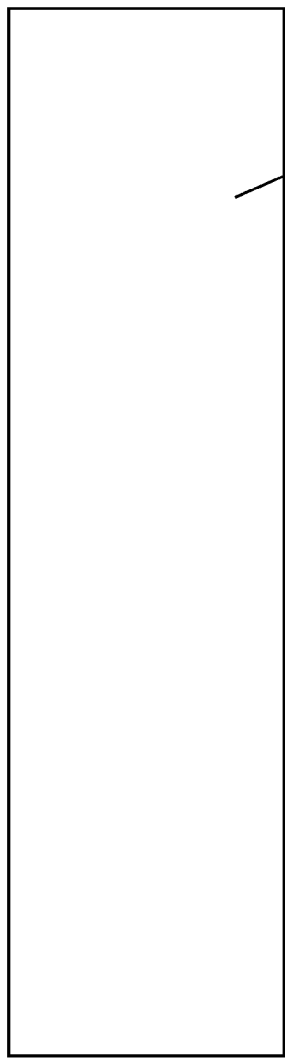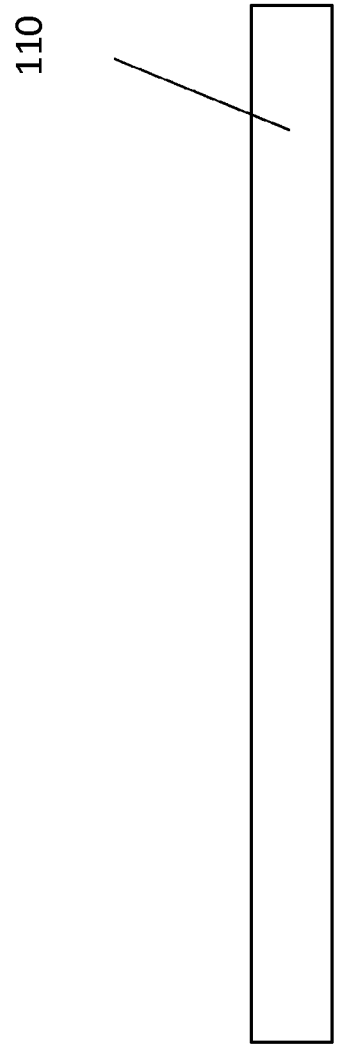
Fig. 1a
Fig. 1b

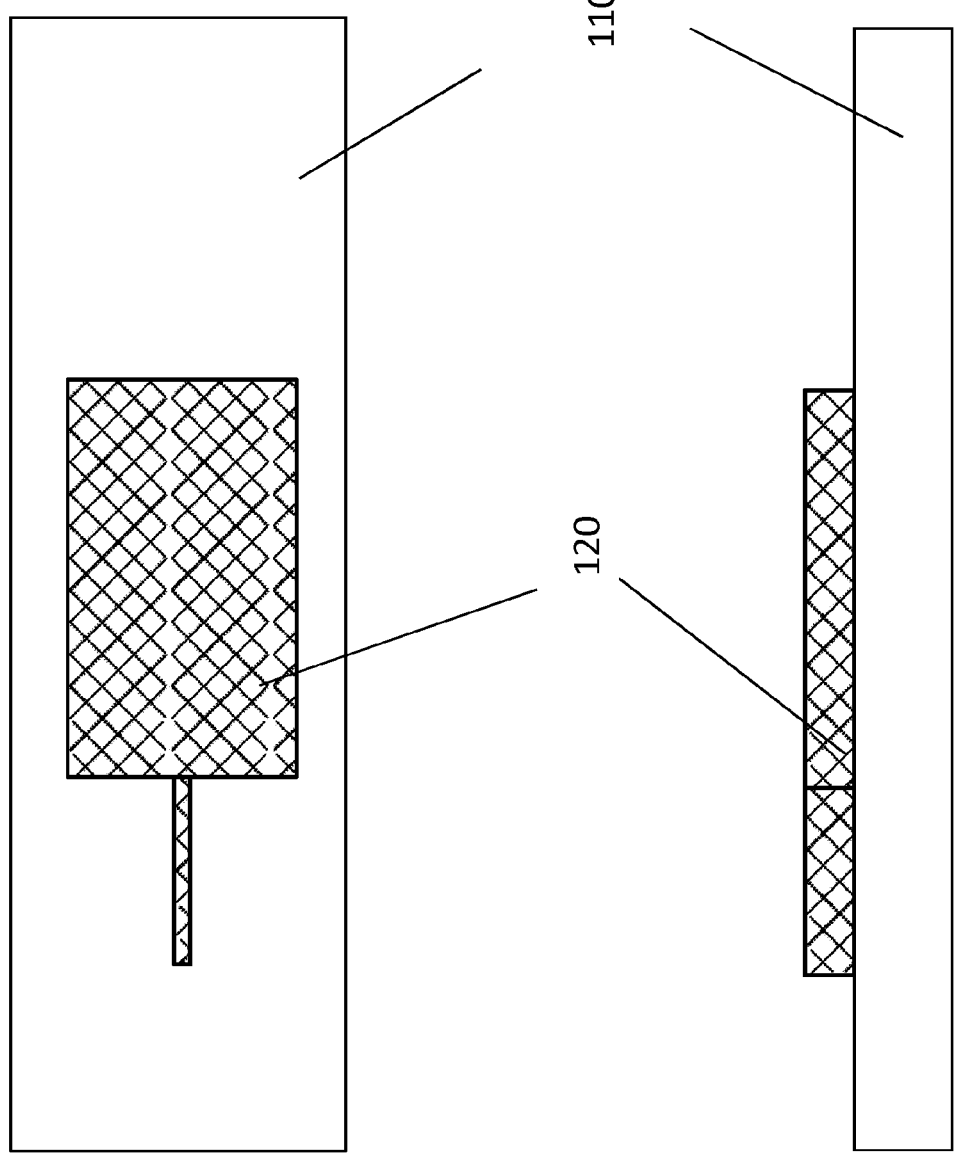

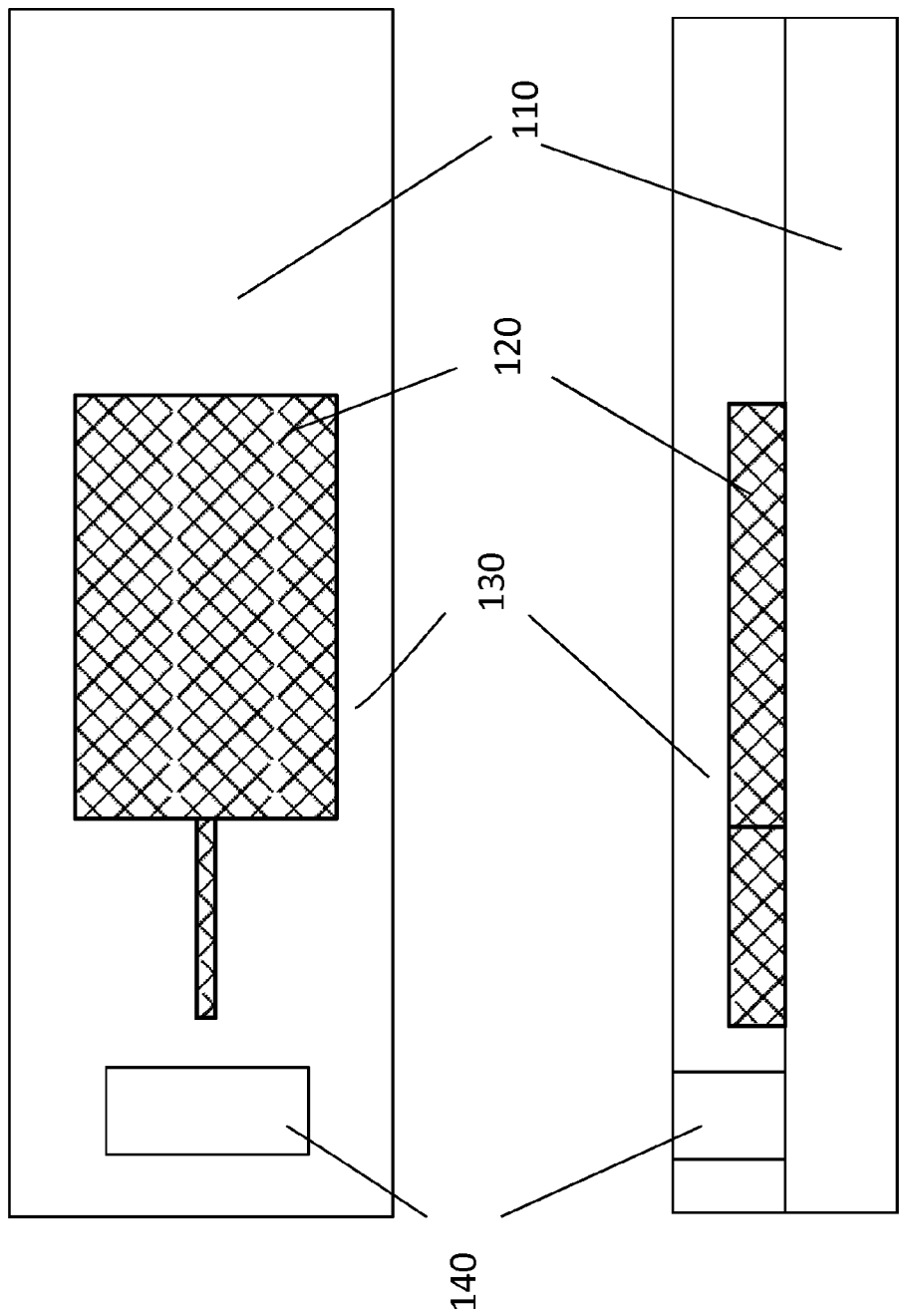

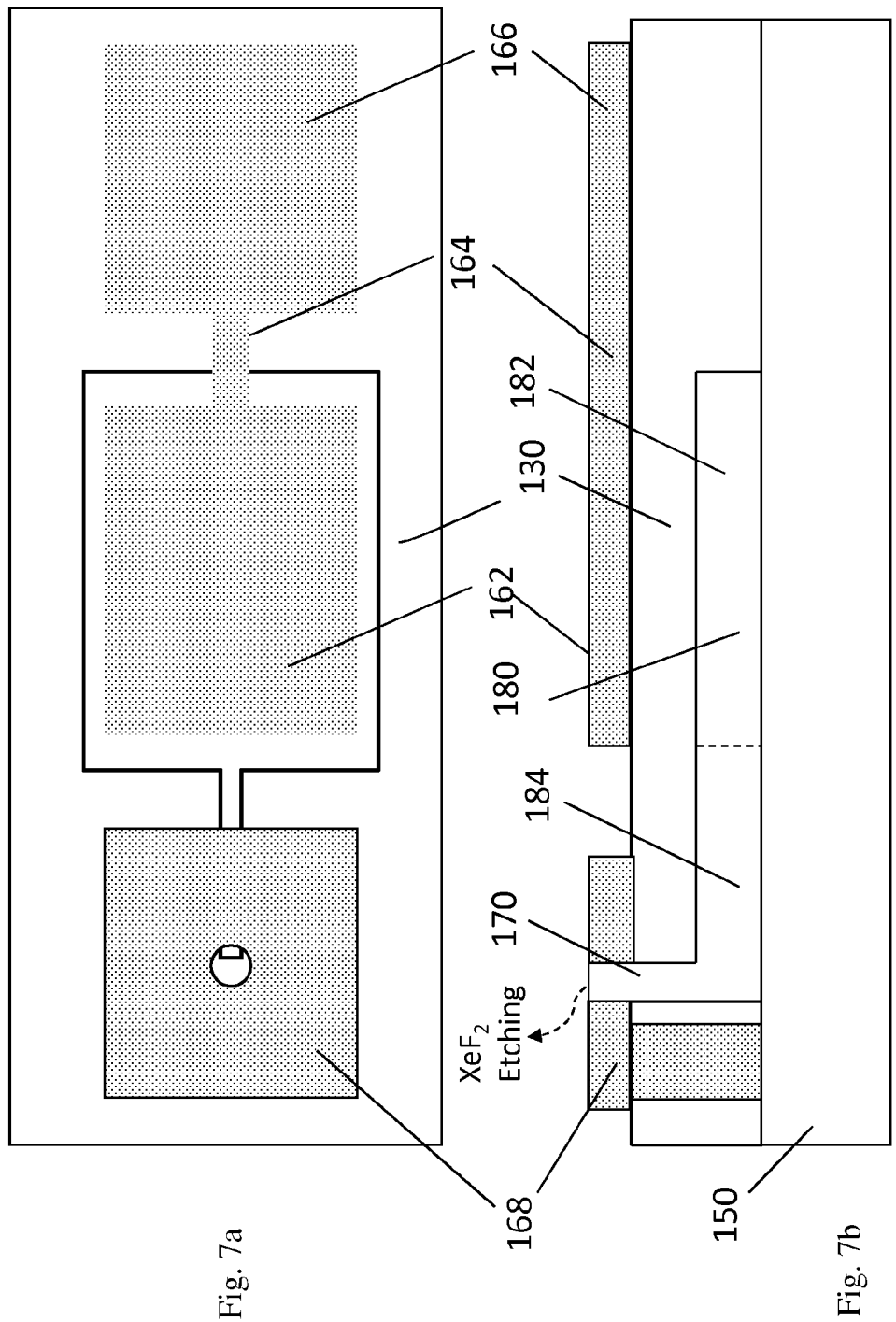

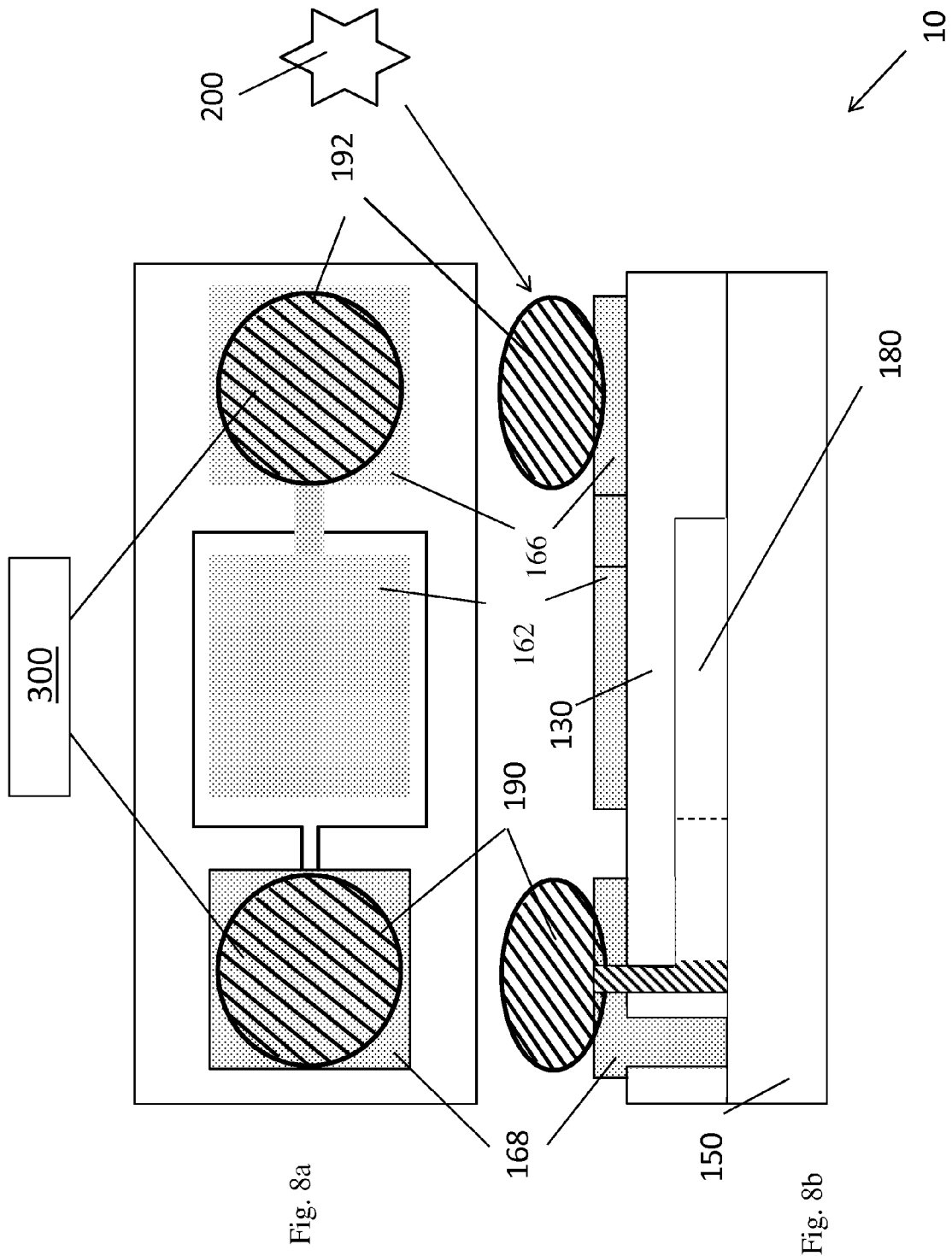

SOLDER BUMP SEALING METHOD AND DEVICE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a methodology for forming a microfabricated device, wherein the device includes a cavity.

Microelectromechanical systems are devices which are manufactured using lithographic fabrication processes originally developed for producing semiconductor electronic devices. Because the manufacturing processes are lithographic, MEMS devices may be made in very small sizes. MEMS techniques have been used to manufacture a wide variety of transducers and actuators, such as accelerometers and electrostatic cantilevers.

MEMS devices are often movable, they may be enclosed in a rigid structure, or device cavity formed between two wafers, so that their small, delicate structures are protected from shock, vibration, contamination or atmospheric conditions. Many such devices also require an evacuated environment for proper functioning, so that these device cavities may need to be hermetically sealed after evacuation. Thus, the device cavity may be formed between two wafers which are bonded using a hermetic adhesive.

One such device which may require evacuation is an electrostatic MEMS switch, wherein a set of conductive terminals is closed when an electrostatic potential is placed between a set of nominally parallel plates. The plates may be located above and below a cavity. The force arising from the application of the electrostatic potential may cause a deflection of the upper plate toward the lower plate, or the lower plate toward the upper. In any event, this motion may be used to make contact between a set of electrical conductors. Various techniques for creating this evacuated cavity are described in, for example, U.S. Pat. No. 7,528,691, issued May 5, 2009, U.S. Pat. No. 7,893,798, issued Feb. 22, 2011 and U.S. Pat. No. 7,864,006, issued Jan. 4, 2011. In each case, the method requires forming a cavity using a hard standoff, and sealing the cavity with another substrate applied to the hard standoffs. Similarly, U.S. Pat. No. 8,698,376 describes a cavity which becomes a buried cavity upon bonding with a piezoelectric substrate. The techniques are not suitable for other architectures which may, for example, require a cavity buried below a substrate surface.

U.S. Pat. No. 8,633,553 issued Jan. 21, 2014 discloses a process for forming a buried cavity within a body of semiconductor material, separated from a top surface of the body by a first surface layer. The cavity is formed with an access duct for fluid communication between the buried cavity and an external environment, and the cavity is etched through this duct. The duct remains with the device, and no method is set forth for sealing this duct. Accordingly, this method does not yield a vacuum cavity required for many MEMS devices.

Accordingly, the formation of sealed vacuum cavities in microfabricated devices remains an unresolved problem.

SUMMARY

In the systems and methods described here, the cavity is formed using a sacrificial layer. The cavity is formed by introducing an etchant though a release hole and applying the etchant to the sacrificial layer. After the sacrificial layer is removed, forming the cavity thereby, the release hole may be sealed with low temperature solder, using a bump bonding technique.

More generally, the method includes forming an electrically conductive layer on the fabrication substrate, forming at least one release hole in the electrically conductive layer, introducing an etchant through the release hole, forming the cavity under the electrically conductive layer by removing material, and sealing the cavity and release hole with a first quantity of low temperature solder. This method may form a device with a cavity formed beneath an electrically conductive layer, a release hole between the cavity and the electrically conductive layer, a first quantity of low temperature solder material which substantially seals the cavity and the release hole from the ambient environment.

The method may be applied to the fabrication of, for example, an electrostatic switch having an upper and lower electrode on either side of the solder bump-sealed cavity. The switch closes when a voltage potential is applied to the upper and lower electrodes. The solder bumps may be used as the electrical pads, electrically coupled to the respective electrodes.

Alternatively, the cavity may be filled with a preferred environment, such as an insulating gas, which resists electrical breakdown or arcing between the electrodes. For example, if the switch is to be used in a relatively high voltage environment to transmit signals, the desired gas may be an insulating gas such as sulfur hexafluoride ($SF_6$) or a freon such as $CCl_2F_2$ or $C_2Cl_2F_4$. The insulating gas is then sealed within the cavity 180 by applying the solder bump 190 in a vacuum chamber containing the preferred gas.

Other embodiments may include resonators, actuators, and other microfabricated products making use of an evacuated cavity.

BRIEF DESCRIPTION OF THE DRAWINGS

Various exemplary details are described with reference to the following figures, wherein:

FIG. 1a shows a plan view of a fabrication substrate at the first step of an exemplary method; FIG. 1b shows a cross sectional view of the fabrication substrate at the first step of the exemplary method;

FIG. 2a shows a plan view of a fabrication substrate at the second step of the exemplary method; FIG. 2b shows a cross sectional view of the fabrication substrate at the first step of the exemplary method;

FIG. 4a shows a plan view of a fabrication substrate at the fourth step of the exemplary method; FIG. 4b shows a cross sectional view of the fabrication substrate at the fourth step of the exemplary method;

FIG. 7a shows a plan view of a fabrication substrate at the seventh step of the exemplary method; FIG. 7b shows a cross sectional view of the fabrication substrate at the seventh step of the exemplary method; and FIG. 8a shows a plan view of a fabrication substrate at the eighth step of the exemplary method; FIG. 8b shows a cross sectional view of the fabrication substrate at the eighth step of the exemplary method.

DETAILED DESCRIPTION

Figures 3A, 3B:
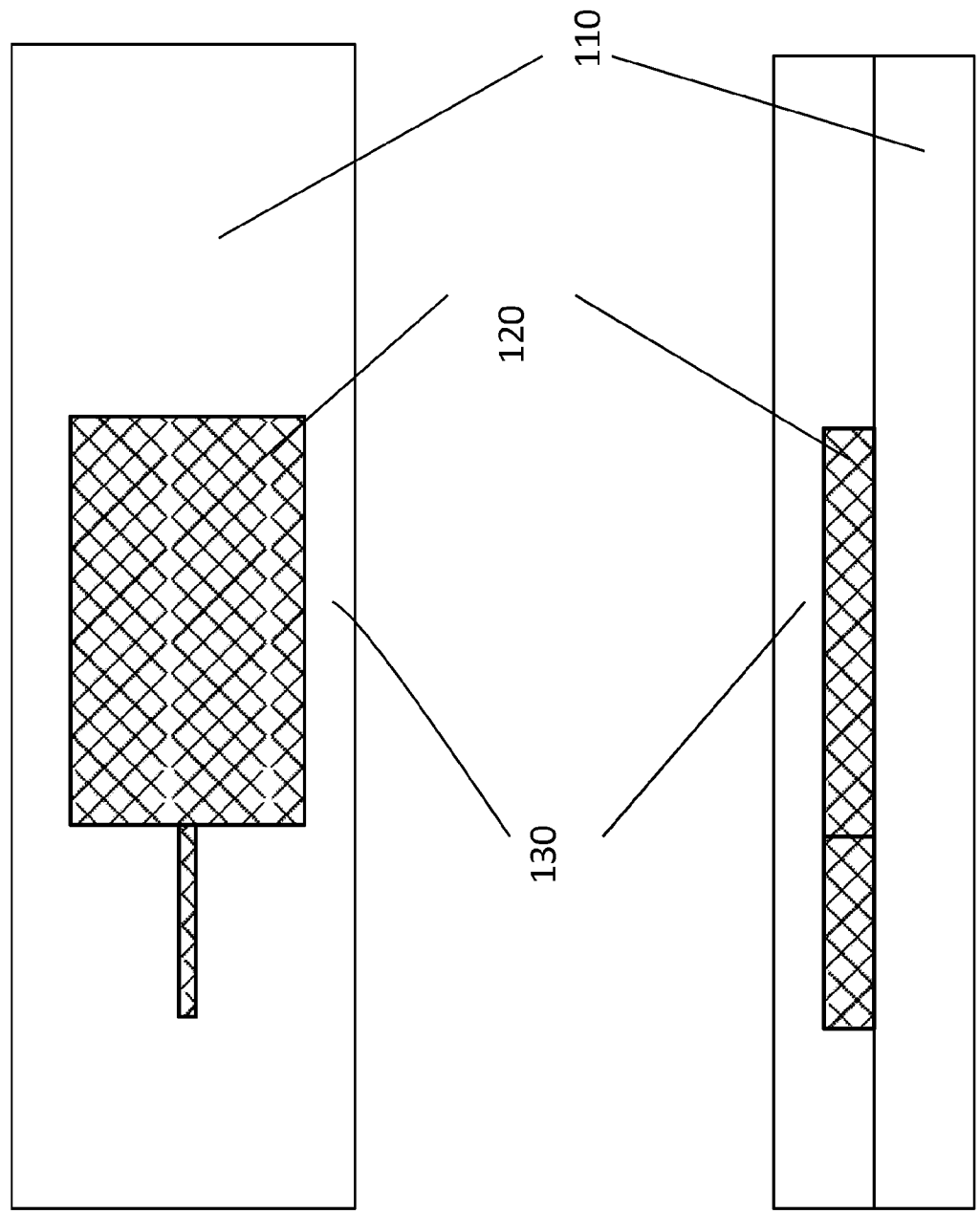
FIG. 3a shows a plan view of a fabrication substrate at the third step of the exemplary method.
FIG. 3b shows a cross sectional view of the fabrication substrate at the third step of the exemplary method.

The device and method described below are described with respect to a particular embodiment, that of an electrostatic MEMS switch, wherein the application of a voltage across two electrodes results in the deformation of at least one of the electrodes, thereby closing the switch. Exemplary devices which may use such a cavity are disclosed in U.S. Pat. No. 7,528,691, issued May 5, 2009; U.S. Pat. No. 7,893,798 issued Feb. 22, 2011; and U.S. Pat. No. 7,864,006, issued Jan. 4, 2011. Each of these patents is incorporated by reference in its entirety. It should be understood that the electrostatic switch embodiment is exemplary only, and that the system and method may be applied to any device which can make use of a buried cavity. For example, resonators and actuators may make use of these techniques.

In the systems and methods described here, the cavity is formed by introducing an etchant though a release hole and applying the etchant to a sacrificial layer. After the sacrificial layer is removed, the release hole may be sealed with low temperature solder, using a solder bumping technique. In this case, the cavity forms a void below a flexible membrane which is deflected by the application of a voltage applied to an upper conductor disposed on the membrane, and a lower conductor disposed beneath the cavity.

More generally, the method includes forming an electrically conductive layer on the fabrication substrate, forming at least one release hole in the electrically conductive layer, introducing an etchant through the release hole, forming the cavity under the electrically conductive layer by removing sacrificial material, and sealing the cavity and release hole with a first quantity of low temperature solder. This method may form a device with a cavity formed beneath an electrically conductive layer, a release hole between the cavity and the electrically conductive layer, a first quantity of low temperature solder material which substantially seals the cavity and the release hole from the ambient environment. It should be understood that not all the steps set forth below may be required to practice the invention, and that the invention is limited only by the appended claims.

FIG. 1 shows an exemplary substrate 110 which may be suitable for practicing this invention. The substrate may be comprised of any suitable or convenient material, including silicon, silicon dioxide ($SiO_2$) glass, metal or ceramic. It may be preferable, depending on the application, that the substrate be electrically conductive. In some embodiments, the substrate may have a characteristic thickness of about 500 um, which provides sufficient strength to be handled and manipulated easily by personnel and manufacturing equipment. The substrate may have a polished, flat and clean surface upon which further lithographic processes may be carried out. The substrate may have a substantial lateral extent, for example, 6 inches or 8 inches, so that a large number of similar devices may be batch fabricated on a single substrate surface. In one embodiment, the substrate 110 comprises polysilicon or single crystal silicon. FIG. 1a shows the substrate 110 in plan view, and FIG. 1b shows the substrate in cross section.

FIGS. 2a and 2b illustrate a second step in the process, wherein a sacrificial material 120 is deposited on the substrate 110 surface. FIG. 2a shows the condition of the substrate in plan view, and FIG. 2b shows the cross section. In one embodiment, the sacrificial layer 120 comprises amorphous silicon, which may be patterned using standard lithographic techniques known in the art. It should be understood that while not shown in FIGS. 2a and 2b, an etch stop or isolation layer may be formed beneath the sacrificial layer 120, such as $SiO_2$ or silicon nitride $Si_xN_y$. The sacrificial layer may be sputter deposited to a thickness of about 0.5 microns (500 nm), and then patterned as shown in FIG. 2a. The lateral extent of the sacrificial layer will depend on the application, but may be, for example, about 100 microns on a side. A narrower portion 124 may be formed at the same time, whose function will be described later in the description of FIG. 5. The shapes shown in FIGS. 2a and 2b may be formed using well known photolithographic procedures and reactive ion etching (RIE) in conjunction with a layer of patterned photoresist. The $SiO_2$ covering the silicon substrate may be protected from the etching process by the photoresist layer, while the uncovered sacrificial layer 120 is removed in the shape shown. The photoresist may then be removed from the surface for further processing. Although a polygonal or rectangular shape 120 is shown in FIG. 2a, it should be understood that this is exemplary only, and that relatively complex shapes and features may be made instead.

The sacrificial material 120 may have at least two regions, one extended region 122 under the flexible membrane, and a second narrow region 124. As will be described further below in the description of FIG. 5, the narrow region 124 may connect a release hole with the extended region 122. This shape will also correspond to the shape of the resulting cavity after the sacrificial material 120 is removed.

FIGS. 3a and 3b illustrate the next steps in the exemplary process, which may include the deposition of a membrane layer 130. The membrane layer may be nitride or silicon nitride $SiN_x$, for example, $Si_3N_4$. The membrane layer may be deposited using plasma enhanced chemical vapor deposition (PECVD). If a silicon dioxide or metal material is used instead of nitride, these materials could be sputter deposited. The thickness of the membrane material 130 may be on the order of 0.5 microns to 1 micron thick. Although not shown for simplicity, the membrane layer 130 may be deposited conformally over the sacrificial layer 120. Because the exemplary device described here is an electrostatically actuated switch, the membrane layer 130 should be made thin enough to flex under the applied electrostatic forces. It should be understood that this embodiment is exemplary only, and the techniques described here may be used to make cavities for any number of applications, including sensors, vibrators, oscillators, and resonators to name just a few. Accordingly, the method may further include forming a flexible membrane over the sacrificial layer, and releasing the membrane by etching the sacrificial material from the cavity.

In the example described here, the flexible membrane 130 may be a top contact of an electrical switch, which shorts two poles when activated (closed). For this application, it is useful to have the membrane material be an electrical insulator. Suitable membrane materials include the previously mentioned silicon nitride, but may also be an oxide-nitride-oxide (ONO) multilayer stack used extensively for such applications. As before, FIG. 3a shows the condition of the substrate in plan view, and FIG. 3b shows the cross section.

In the electrostatic switch embodiment, it is also useful to have electrical access to a first electrode and an opposing second electrode. In this example, the silicon substrate 110 may serve as the lower electrode and a second deposited layer, described below, may form the upper electrode, wherein the upper and lower electrodes form an electrostatically actuated switch. When a voltage is applied between these electrodes, the electrostatic force may cause a bending of the membrane to close the switch. The switch may be a DC switch with a direct connection between and input and output line, or it may be a capacitive switch which acts like a short at sufficiently high frequencies. It should be understood that the electrostatic switch described here is but one exemplary embodiment, and that the systems and methods may be applied to other devices, and are especially applicable to electrostatically actuated devices such as including sensors, vibrators, oscillators, and resonators Accordingly, electrical access may be needed to the lower electrode, in this case, the silicon substrate 110. FIGS. 4a and 4b illustrate an exemplary process in plan view (FIG. 4a) and cross section (FIG. 4b). The substrate is again covered with photoresist and patterned to define access hole or opening 140 to the lower electrode. This access hole 140 may be made using reactive ion etching (RIE) for example. Alternatively, the opening 140 may be milled. In one embodiment the shape may be rectangular, e.g. 50 microns×100 microns, but the exact shape may depend upon the details of the application. Therefore, forming an access hole may include forming the access hole with reactive ion etching with a photoresist mask.

Metallization, or an upper conductive material 160 may then be deposited to form the upper electrode, and to gain access to the lower (Si) electrode. The metallization layer 160 may include a thin layer of Titanium (Ti) for adhesion, followed by a layer of gold (Au) conductor. The Ti layer may be 10 nm thick, and the layer of Au may be 200 nm thick. These layers may be deposited with a sputter tool and patterned in the usual way, using, for example, photoresist and wet etching or lift off.

Alternatively, the metallization or upper conductive material 160 may be blanket deposited and then patterned by etching through a photoresist mask. In either case, metallization pad 168 is left allowing access to the lower electrode 150 and metallization pad 166 allows access to the upper electrode 162. In embodiments where the access hole 140 has a large aspect ratio (i.e., access hole 140 is narrow and deep) the lower electrode metallization may be deposited by plating into the access hole 140. In either case, the method may include forming a first electrical pad which provides electrical access to a lower electrode, and forming a second electrical pad which provides electrical access to an upper electrode disposed over the flexible membrane.

Figures 5A, 5B:
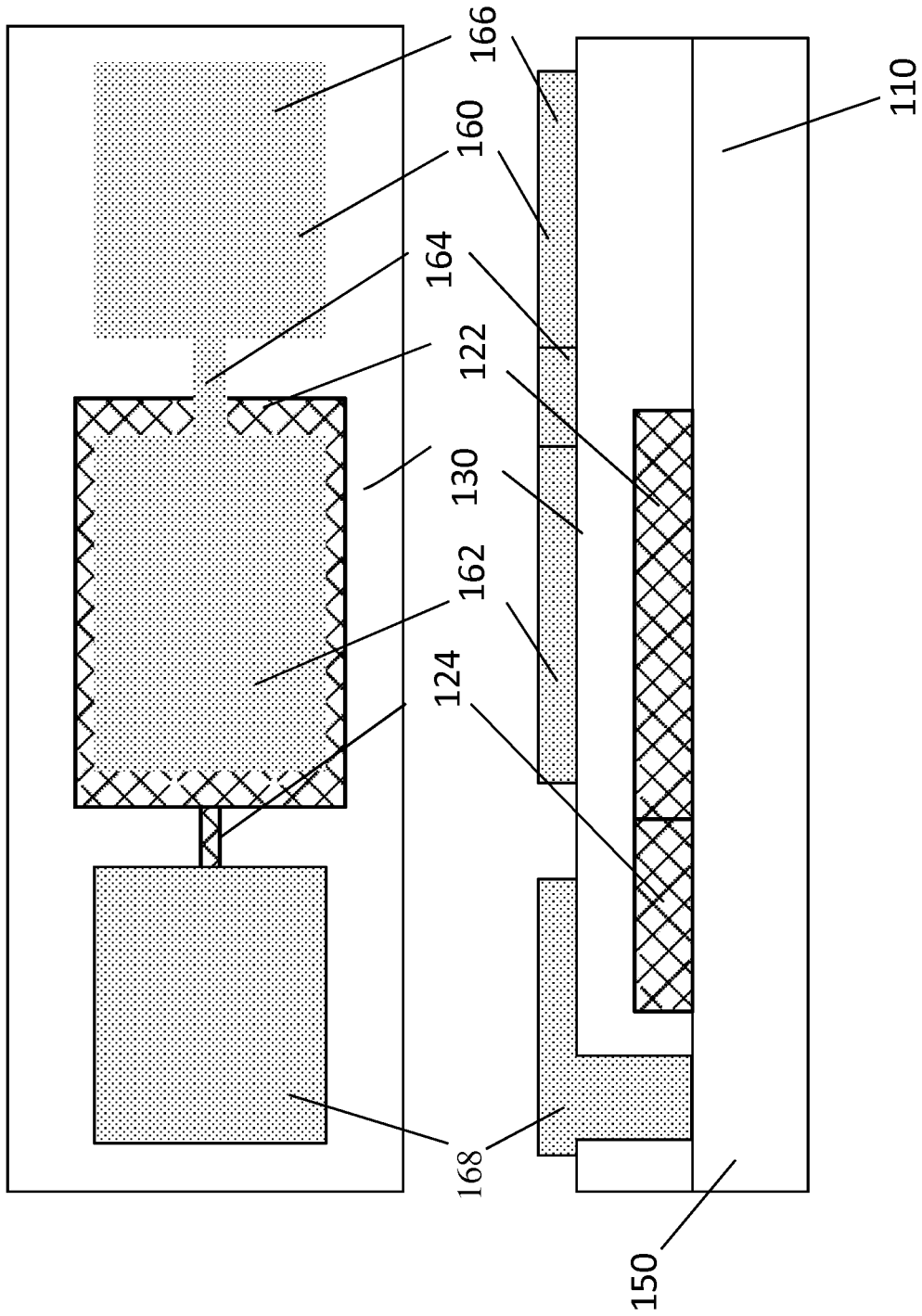
FIG. 5a shows a plan view of a fabrication substrate at the fifth step of the exemplary method.
FIG. 5b shows a cross sectional view of the fabrication substrate at the fifth step of the exemplary method.

FIG. 5a shows the condition of the substrate in plan view, and FIG. 5b shows the cross section. The metallization layer or an upper conductive material 160 may comprise several regions.

One region 162 may form the upper electrode, as it is disposed on the flexible membrane 130. The upper conductive material 160 may further comprise a laterally adjacent region 166, laterally adjacent to the upper electrode 162 over the flexible membrane. The laterally adjacent region 166 and the upper electrode 162 may be electrically connected by a narrow isthmus 164 of the upper conductive material. By having the metallization layer restricted to a narrow region 164 reduces the field lines occurring in this region, which may otherwise interfere with the functioning of the switch or the signal travelling in the input and/or output lines of the switch.

Figures 6A, 6B:
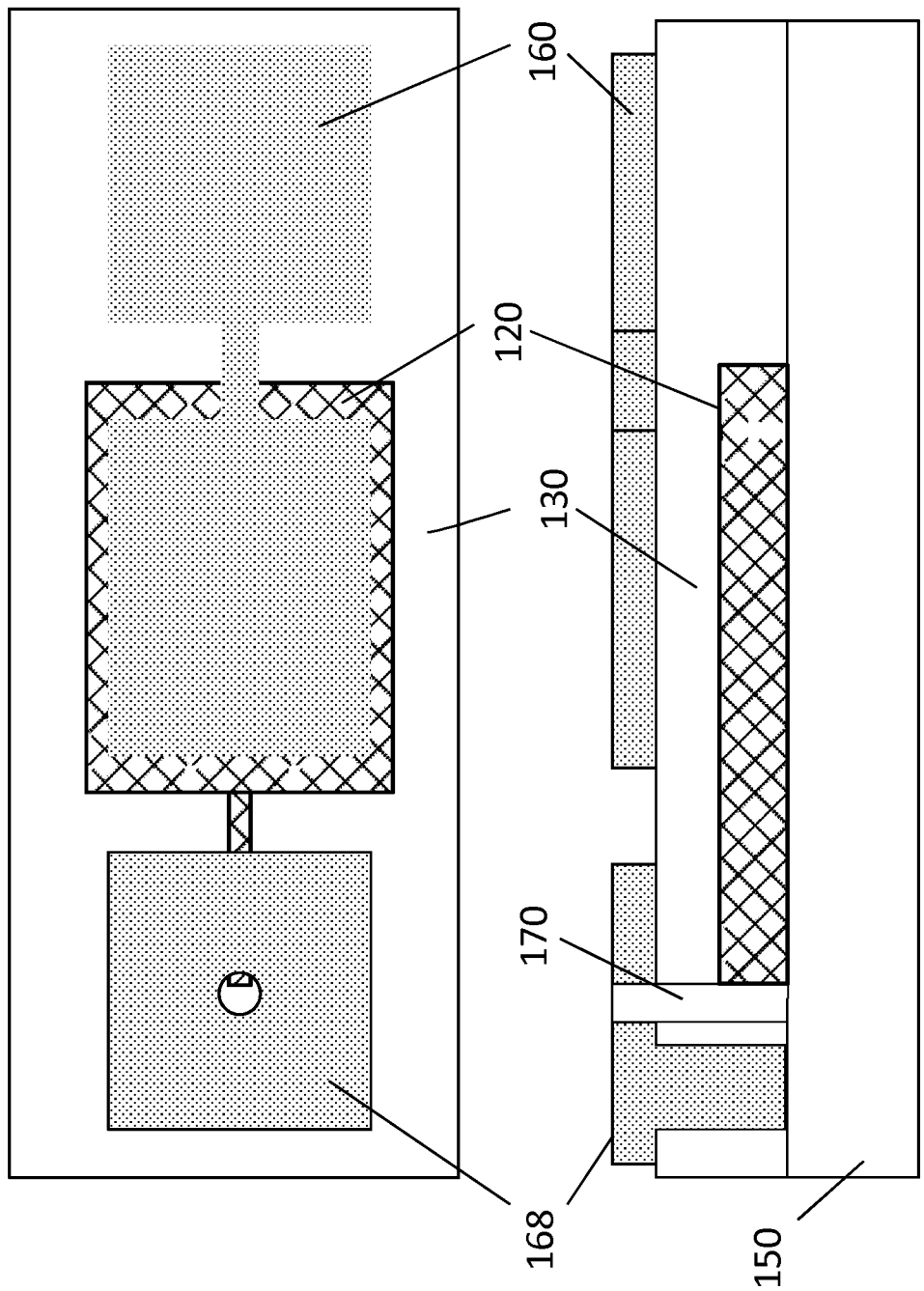
FIG. 6a shows a plan view of a fabrication substrate at the sixth step of the exemplary method.
FIG. 6b shows a cross sectional view of the fabrication substrate at the sixth step of the exemplary method.

A release hole 170 may now be formed in the structure as shown in FIGS. 6a and 6b. FIG. 6a shows the condition of the substrate in plan view, and FIG. 6b shows the cross section. The release hole 170 may be formed through patterned photoresist using once again reactive ion etching. The RIE process will need to pattern the Ti/Au upper conductive material 160, as well as the membrane layer 130 and the sacrificial layer 120. The release hole may be on the order of 10-50 microns in diameter and may be formed by reactive ion etching for a duration of about 15 minutes. It should be understood that the features shown in the accompanying figures are not drawn necessarily to scale, and the release hole may be much wider in relation to the layer thicknesses than is shown. Accordingly, the cross sectional figures (FIG. 1b, 2b, 3b, etc.) should be understood to be greatly expanded in order to show their structure, relative to the plan views. However, since the release hole may have a wide range of dimensions and may have no other noteworthy features, it is shown on scale with the other structures in the cross sectional views. The size of the release hole may also, in turn, depend on the size and materials used in the sacrificial layer 120, and thus it may have a wide range of dimensions. It should be noted, however, that a minimum hole dimension of about 2 microns should be observed in order to allow the etchant to pass through, as described next. The release hole 170 should be formed in a location so as to provide access to the sacrificial layer 120 buried beneath the membrane layer 130. A convenient location is to locate it near the edge of the sacrificial layer boundary, as shown in FIGS. 6a and 6b. Therefore, forming a release hole may include forming the release hole with reactive ion etching with a photoresist mask.

Having formed the release hole 170, an etchant may be introduced into the processing chamber. A suitable etchant for the silicon dioxide sacrificial layer may be xenon difluoride ($XeF_2$) introduced in a pressure range of about 2 to 4 Torr. A typical etch rate for silicon may be 2 um/min, and amorphous silicon may be 6 um/min. In the case of an amorphous membrane and an $SiO_2$ sacrificial layer, the sacrificial material may be removed in about 4-5 minutes, leaving an empty cavity 180 below the membrane 130. It should be noted that depending upon the release hole shape and size, the etch time may vary. Accordingly, forming the cavity 180 may comprise forming a sacrificial layer 120 under the upper conductive material 160, forming a release hole 170 through the upper conductive material 160 to the sacrificial layer 120, and etching the sacrificial material 120 through the release hole 170 to form the cavity 180.

Because of the shape of the sacrificial layer 120, specifically that the sacrificial layer may have an extended region 122 and a narrow region 124, the resulting cavity may also have an extended region 182 and a narrow region 184.

Having formed the cavity 180, the upper conductive material 160 and lower conductive material 150 metallization layers, and the membrane 130, it is desirable to seal the cavity 180. This will allow an evacuated cavity to exist below the membrane 130 or a defined environment within the cavity 180. To seal the cavity 180, a low temperature solder material may be used.

Solder bump bonding is a technique that may be used to seal the cavity 180. A nozzle may be brought into the position of the release hole 170 and a quantity of solder dispensed from the nozzle. Upon heating, the solder material may liquefy and be dispensed as a droplet over the release hole 170. Upon contact with the relatively cool substrate surface, the solder material may freeze or solidify, sealing the release hole 170 and thereby, the cavity 180.

For example, if an evacuated cavity is desired, the entire structure shown in FIGS. 7a and 7b may be placed in a vacuum chamber with a solder dispensing nozzle. The chamber is evacuated, the nozzle positioned over a particular hole, and solder dispensed into the hole. The nozzle may be moved over the substrate surface robotically, such that the release hole 170 is quickly sealed in an automated fashion. Using this technique, the first and second electrical pads may also include a first 190 and a second 192 quantity of low temperature solder. A first quantity 190 may seal the release hole 170 and provide a conductive path between the lower electrode 150 a voltage source 300. A second quantity 192 may provide a conductive path between the electrical pad 166, upper electrode 162 and the voltage source 300. Thus, the cavity 180 may thus be sealed with a quantity of low temperature solder dispensed through a heated nozzle and placed robotically over the at least one release hole.

Accordingly, the device may be fabricated by forming a first electrical pad which provides electrical access to a lower electrode, forming a second electrical pad which provides electrical access to an upper electrode disposed over the flexible membrane. The first and second electrical pads may comprise the first and a second quantity of low temperature solder.

Solder bumping tools which dispense quantities of low temperature solder in precise locations are known in the industry. The solder may be dispensed in droplets at the orifice of a nozzle which may be heated by, for example, a laser source 200. The nozzle may be positioned by robotic means which are programmed to deposit the droplets in certain locations over a wafer surface in a predefined, computerized pattern. Thus, knowing the locations of the release holes 170 and electrical pads 166 and 168, the cavities can be sealed by performing the bumping under vacuum, in a convenient, automated process. Accordingly, the first quantity of low temperature solder may be dispensed in certain predefined locations on substrate surface, by a robotically controlled dispenser, such as a heated nozzle.

Using a wetting layer may assist the migration of the molten solder well down into the release hole 170, assuring a good seal. The metallization or upper conductive material 160 may be formulated to be also a wetting material. Examples of appropriate solder materials may include:

SnAgCu
SnAg
PbSn 95/5, PbSn 90/10
AuSn 80/20
InSn
SnBi

Appropriate wetting layer formulations may be
Ni alloy (about 10 nm)+Au (about 100 nm)

It should be understood that these materials are exemplary only, and that any of a large number of alternatives may exist.

FIGS. 8a and 8b depict the completed device structure. FIG. 8a shows the plan view, and 8b shows the cross section. The finished device 10 has a number of features that result from the novel method used to fabricate it. As mentioned previously, the device 10 may have a cavity 180 formed beneath an electrically conductive layer 160. The electrically conductive layer may form two electrical pads 166 and 168, wherein electrical pad 166 is electrically coupled to the upper electrode 162 and the other electrical pad 168 is coupled to the lower electrode, 150. The lower electrode 150 in this embodiment may be the fabrication substrate 110. Also included in the device are a release hole 170 between the cavity 180 and the electrically conductive layer 160, a first quantity of low temperature solder material 190 which substantially seals the cavity 180 and the release hole 170 from the ambient environment. The release hole 170 formed between the first electrical pad and the cavity, may be at least partially filled with the first quantity of low temperature solder.

The device 10 may further include an electrically conductive material disposed beneath the cavity, which forms a lower electrode of an electrostatic switch, and is electrically coupled to the first quantity of low temperature solder on a top surface of the device. As mentioned, the electrically conductive material disposed beneath the cavity is material of the fabrication substrate.

The device 10 may further include a flexible membrane 130 covering the cavity. The conductive material 162 may be disposed on the flexible membrane, which forms an upper electrode of an electrostatic switch.

To provide electrical access to the device 10, the first quantity of low temperature solder 190 is configured as a portion of the first electrical pad 168, and together the low temperature solder 190 and electrical pad 168 may provide a conductive path between the lower electrode 150 and a voltage source 300. A second quantity of low temperature solder 192 may be configured as a portion of the second electrical pad 166, and together the low temperature solder 192 and electrical pad 166 may provide a conductive path between the upper electrode 162 and a voltage source 300. By applying a voltage between the upper 162 and the lower electrode 150 via the first and second quantity of low temperature solder 190 and 192, the flexible membrane 130 may be actuated, closing the switch.

The cavity 180 may be sealed with a vacuum inside, by applying the low temperature solder in a vacuum chamber. Alternatively, the cavity may be sealed with, for example, an inert gas or a gas which resists electrical breakdown. For example, if the switch is to be used in a relatively high voltage environment to transmit signals, the desired gas may be an insulating gas such as sulfur hexafluoride ($SF_6$) or a freon such as $CCl_2F_2$ or $C_2Cl_2F_4$. The insulating gas is then sealed within the cavity 180 by applying the solder bump 190 in a vacuum chamber containing the preferred gas.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A method for sealing a cavity of a device formed in a fabrication substrate, comprising:

forming an electrically conductive layer on the fabrication substrate;

forming at least one release hole in the electrically conductive layer;

introducing an etchant through the release hole;

forming the cavity under the electrically conductive layer by removing material; and sealing the cavity and release hole with a first quantity of low temperature solder and sealing a second release hole with a second quantity of low temperature solder, wherein the first quantity of low temperature solder is configured as a first electrical pad which provides a conductive path between a lower electrode and a voltage source and a second quantity of low temperature solder is configured as a second electrical pad which provides a conductive path between an upper electrode and the voltage source.

2. The method of claim 1, wherein forming the cavity further comprises:
   forming a sacrificial layer under the electrically conductive layer;
   forming the release hole through the electrically conductive layer to the sacrificial layer; and
   etching the sacrificial layer through the release hole to form the cavity.

3. The method of claim 2, further comprising:
   forming a flexible membrane over the sacrificial layer; and
   releasing the flexible membrane by etching the sacrificial layer from the cavity.

4. The method of claim 3, further comprising:
   forming the first electrical pad which provides electrical access to the lower electrode; and
   forming the second electrical pad which provides electrical access to the upper electrode, wherein the upper electrode is disposed over the flexible membrane.

5. The method of claim 4, wherein the upper and lower electrodes form an electrostatically actuated device.

6. The method of claim 4, wherein the first and second electrical pads comprise the first and a second quantity of low temperature solder.

7. The method of claim 4, wherein forming a release hole comprises forming the release hole with reactive ion etching with a photoresist mask.

8. The method of claim 5, wherein sealing the cavity comprises:
   sealing the cavity with a quantity of low temperature solder dispensed through a heated nozzle over the at least one release hole.

9. The method of claim 8, wherein the low temperature solder is dispensed in predefined locations on the substrate, by a robotically controlled dispenser.

10. The method of claim 2, wherein etching the sacrificial layer comprises etching the sacrificial material in a vacuum chamber with about 2-4 Torr of $XeF_2$.

11. A device with a cavity, comprising:
    a cavity formed beneath an electrically conductive layer;
    a release hole between the cavity and the electrically conductive layer;
    a first quantity of low temperature solder material which substantially seals the cavity and the release hole from the ambient environment, and wherein the first quantity of low temperature solder is configured as first electrical pad which provides a conductive path between a lower electrode and a voltage source; and
    a second quantity of low temperature solder is configured as a second electrical pad which provides a conductive path between an upper electrode and the voltage source.

12. The device of claim 11, further comprising:
    an electrically conductive material disposed beneath the cavity, which forms the lower electrode of an electrostatic switch, and is electrically coupled to the first quantity of low temperature solder on a top surface of the device.

13. The device of claim 12, wherein the electrically conductive material disposed beneath the cavity is material of the fabrication substrate.

14. The device of claim 11, further comprising:
    a flexible membrane covering the cavity; and
    an upper conductive material disposed on the flexible membrane, which forms the upper electrode of an electrostatic device.

15. The device of claim 14, wherein the release hole formed between the first electrical pad and the cavity which is at least partially filled with the first quantity of low temperature solder.

16. The device of claim 15, wherein the cavity has at least two regions, one extended region under the flexible membrane, and a second narrow region, wherein the second narrow region connects the release hole with the extended region.

17. The device of claim 14, wherein the upper conductive material is also disposed in a laterally adjacent region, laterally adjacent to the upper electrode over the flexible membrane, and the laterally adjacent region is disposed directly beneath the second electrical pad.

18. The device of claim 17, wherein the laterally adjacent region and the upper electrode are electrically connected by a narrow isthmus of the upper conductive material.

* * * * *